United States Patent [19]

Jochems

[11] Patent Number: 4,466,171
[45] Date of Patent: Aug. 21, 1984

[54] METHOD OF MANUFACTURING A SEMICONDUCTOR DEVICE UTILIZING OUTDIFFUSION TO CONVERT AN EPITAXIAL LAYER

[75] Inventor: Pieter J. W. Jochems, Eindhoven, Netherlands

[73] Assignee: U.S. Philips Corporation, Tarrytown, N.Y.

[21] Appl. No.: 257,672

[22] Filed: Apr. 24, 1981

[30] Foreign Application Priority Data

Apr. 29, 1980 [NL] Netherlands .................... 8002492

[51] Int. Cl.³ .................... H01L 21/20; H01L 21/225
[52] U.S. Cl. .................... 29/571; 29/576 E; 29/577 C; 29/578; 29/580; 148/1.5; 148/175; 148/190; 148/191; 357/22; 357/42; 357/44; 357/48; 357/89; 357/90
[58] Field of Search .................... 29/571, 576 B, 576 E, 29/577 C, 578, 580; 148/1.5, 175, 187, 190, 191; 357/22, 42, 44, 48, 89, 90

[56] References Cited

U.S. PATENT DOCUMENTS

| | | | |
|---|---|---|---|
| 3,793,088 | 2/1974 | Eckton | 148/1.5 |
| 3,928,091 | 12/1975 | Tachi et al. | 148/175 |
| 4,099,998 | 7/1978 | Ferro et al. | 148/190 X |
| 4,151,010 | 4/1979 | Goth | 357/89 X |
| 4,168,997 | 9/1979 | Compton | 148/175 |
| 4,209,795 | 6/1980 | Nonaka | 357/22 |
| 4,280,272 | 7/1981 | Egawa et al. | 148/190 X |
| 4,373,253 | 2/1983 | Khadder et al. | 29/571 X |

OTHER PUBLICATIONS

Czorny, B., "Epitaxy–A Versatile Technology for Integrated Circuits", R.C.A. Engineer, vol. 13, No. 3, Oct.-Nov., 1967, pp. 28-33.

*Primary Examiner*—W. G. Saba
*Attorney, Agent, or Firm*—R. J. Meetin; R. T. Mayer; T. A. Briody

[57] ABSTRACT

A method of manufacturing a semiconductor device having two juxtaposed regions (12, 16) of opposite conductivity types which adjoin a surface and which together constitute a p-n junction (9) which is preferably perpendicular to the surface and the doping concentration of which decreases towards the surface. According to the invention n-type and p-type buried layers (2, 6) are provided beside each other on a semiconductor substrate (1) and on said layers a high-ohmic epitaxial layer (7) is grown. By heating, the dopants diffuse from the buried layers through the whole thickness of the epitaxial layer and into the substrate. With suitably chosen donor and acceptor atoms (for example boron and phosphorus in silicon) n and p-type regions (12, 16) are formed in the epitaxial layer and form a p-n junction (9) perpendicular to the surface by compensation of the lateral diffusions from the buried layers.

22 Claims, 20 Drawing Figures

METHOD OF MANUFACTURING A SEMICONDUCTOR DEVICE UTILIZING OUTDIFFUSION TO CONVERT AN EPITAXIAL LAYER

BACKGROUND OF THE INVENTION

1. Field of the Invention

The invention relates to a method of manufacturing a semiconductor structure in which a first dopant is introduced into a first surface part of a monocrystalline semiconductor substrate region so as to form at least a first buried layer of a first conductivity type, after which an epitaxial layer is grown on the substrate region and, by diffusion from the first buried layer, the overlying part of the epitaxial layer is converted throughout its thickness into a first region of the first conductivity type.

2. Description of the Prior Art

In manufacturing semiconductor devices, such as monolithic integrated circuits, it is often necessary to form juxtaposed regions of opposite conductivity types adjoining the same semiconductor surface. For example, in circuits comprising complementary insulated gate field effect transistors, the n-channel and the p-channel transistors are provided in juxtaposed regions of different conductivity types. In practice these regions are obtained starting from a substrate region of a first conductivity type in which one field effect transistor is formed. In this substrate region, a region of the second opposite conductivity type is formed by doping at the location intended for another field effect transistor complementary to the first.

This doping may be carried out, for example, by diffusion from the surface in which case the doping concentration generally decreases from the surface. In many cases this is an undesirable doping profile. Such a profile gives rise either to a high threshold voltage for the associated field effect transistor as a result of a high surface doping, or, when this surface doping is chosen low, to a high resistance of the diffused region parallel to the surface. This latter may give rise to undesired phenomena, for example thyristor effects, and the like.

Effort has been made to vary the doping profile in the desired direction in various manners. According to a first method, after the indiffusion, the doping concentration at the surface can be reduced by outdiffusion in an evacuated capsule. However, this is a complicated and expensive process step. In the formation of the second region by ion implantation, a certain quantity of a dopant of the first conductivity type may also be implanted in addition to a dopant of the second conductivity type, so that a lower net doping concentration is obtained at the surface by compensation. However, this is disadvantageous because the charge carrier mobility decreases as a result of the high total doping concentration (donors plus acceptors).

A method as described in the opening paragraph is disclosed in British Patent Specification No. 1,176,263. In this method, a region of the first conductivity type extending up to the surface of the epitaxial layer is formed in an epitaxial layer of the opposite conductivity type by diffusion from a buried layer of the first conductivity type formed between the substrate and the epitaxial layer. The region thus formed has a doping concentration which decreases from the substrate towards the surface. However, the lateral diffusion gives rise to an important lateral expansion of the region, which increases the required crystal area and decreases the packing density of the circuit. In order to reach a maximum packing density, and sometimes also for other reasons, it is desirable to form juxtaposed regions of opposite conductivity types which form a p-n junction with each other which is substantially perpendicular to the semiconductor surface or at least has a direction which is not determined entirely by lateral diffusion from one of the two regions.

SUMMARY OF THE INVENTION

One of the objects of the invention is to provide a method of forming two juxtaposed regions of opposite conductivity types adjoining each other, in which the direction of the p-n junction between these regions can be controlled within certain limits.

The invention is based on using two juxtaposed buried layers of opposite conductivity types placed relative to each other in an adequate manner with efficaciously chosen dopants and doping concentrations.

According to the invention, a method of the kind described in the opening paragraph is characterized in that beside the first buried layer at least a second buried layer of the second conductivity type is provided by introduction of a second dopant and that diffusion from the second buried layer causes the overlying part of the epitaxial layer to be converted throughout its thickness into a second region of the second conductivity type, the first and the second buried layers being provided so closely together that the first region and the second region adjoin each other over substantially the whole thickness of the epitaxial layer and form a p-n junction.

By using the method according to the invention it is possible, by suitable choice of the mutual distance between the buried layers, the dopants of the buried layers (i.e., basically the diffusion coefficients) and the doping concentrations, to influence and control within certain limits the shape and direction of the p-n junction between the two regions formed by diffusion from the buried layers. Semiconductor devices of a variety of natures can be manufactured by means of this method.

Although dopants having diffusion coefficients differing at the same temperature may be chosen for the two buried layers, a preferred embodiment of the method according to the invention is characterized in that the first dopant and the second dopant have substantially the same diffusion coefficients in the epitaxial layer at any chosen diffusion temperature. Such dopants are, for example, phosphorus and boron (in silicon). Advantageously, first and second buried layers are moreover provided with substantially the same surface doping concentration (at the substrate surface). In that case the resulting p-n junction between the two adjoining diffused regions is substantially perpendicular to the surface.

In most cases it is preferable that the resulting p-n junction between the first and second regions in the epitaxial layer be substantially perpendicular to the surface. Instead of choosing dopants with the same diffusion coefficient and concentration, this can be done approximately by using other suitably chosen combinations of diffusion coefficients and doping concentrations, in which, for example, the dopant with the smallest diffusion coefficient is supplied at a larger doping concentration.

When the buried layers do not adjoin each other, they should be provided so closely together that the first and second regions adjoin each other over at least a part of the thickness of the epitaxial layer as a result of lateral diffusion. The method is preferably carried out so that the first and second regions adjoin each other over the whole thickness of the epitaxial layer. This can be achieved most simply by ensuring that the two layers adjoin each other substantially.

The invention is of particular interest in a preferred embodiment in which source and drain zones of the second conductivity type of a first insulated gate field effect transistor are provided in the first region and source and drain zones of the first conductivity type of a second insulated gate field effect transistor complementary to the first are provided in the second region. The packing density of circuits with such C-MOST combinations can be considerably increased by using the invention.

Another important preferred embodiment is characterized in that the substrate region is of the first conductivity type and that the second buried layer entirely laterally surrounds at least a part of the first buried layer. By diffusion from the first buried layer a first region of the first conductivity type with substantially constant cross-section entirely laterally surrounded by the second region is formed and extends from the substrate region through the epitaxial layer towards the surface and forms the channel region of a p-n junction field effect transistor, the second region of which is the gate region. Source and drain electrodes are provided on the surface of the epitaxial layer and on the substrate region.

BRIEF DESCRIPTION OF THE DRAWINGS

The invention will now be described in greater detail with reference to the drawings, in which FIG. 12 is a plan view of the part of the semiconductor device of which FIG. 11 is a cross-sectional view taken on the line XI—XI, FIG. 19 is a plan view of the part of the semiconductor device of which FIG. 18 is cross-sectional view taken on the line XVIII—XVIII.

Figure 19:
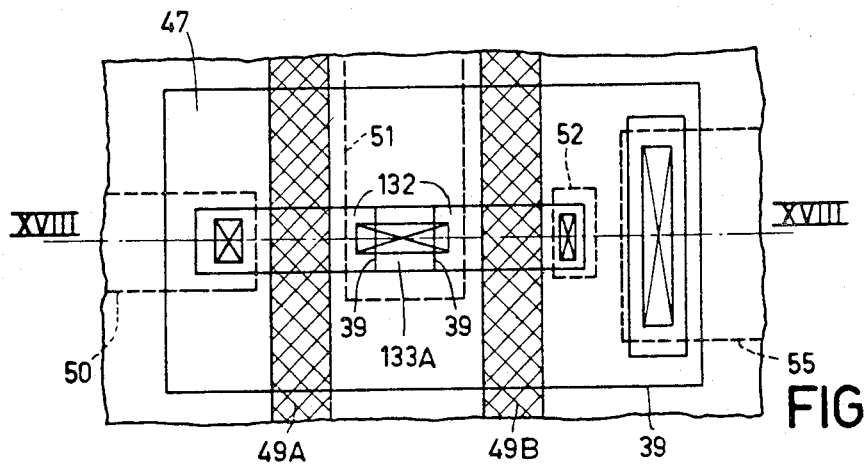

The figures are diagrammatic and not drawn to scale in which for clarity in particular the dimensions in the direction of thickness are exaggerated. Corresponding components are generally referred to by the same reference numerals. In the cross-sectional views semiconductor zones of the same conductivity type are shaded in the same direction. In the plan views shown in FIGS. 12 and 19 the outlines of metal layers are shown in broken lines.

DESCRIPTION OF THE PREFERRED EMBODIMENTS

FIGS. 1 to 12 show the manufacture of a semiconductor device by using the method according to the invention in successive stages. In this case it concerns the manufacture of a semiconductor device having at least two complementary insulated gate field effect transistors.

The starting material (see FIG. 1) is a monocrystalline semiconductor substrate region 1, in this example a silicon wafer of p-conductivity type. As will be described in greater detail hereinafter, a first dopant is introduced into a first surface part of the substrate region 1 so as to form at least a first buried layer 2 (see FIG. 4) of a first conductivity type, in this case n-conductivity type. An epitaxial layer 7 is then grown on the substrate region 1 (see FIG. 5), and the overlying part of the epitaxial layer 7 is then converted throughout its thickness by diffusion from the first buried layer 2 into a first region 12 of the first (n) conductivity type (see FIG. 6) having a net doping concentration decreasing from the substrate region 1 towards the surface.

According to the invention, at least a second buried layer 6 of the second p-conductivity type (see FIG. 4) is provided beside the first buried layer 2 by introduction of a second dopant, after which the overlying part of the epitaxial layer 7 (see FIG. 6) is converted throughout its thickness by diffusion from the second buried layer 6 into a second region 16 of the p-conductivity type, also having a net doping concentration decreasing from the substrate region 1 towards the surface. The first and second buried layers 2 and 6 are provided so closely together that the first region 12 and the second region 16 adjoin each other over substantially the whole thickness of the epitaxial layer 7. Together they constitute a p-n junction 9 extending transversely to the surface.

The method will now be described in greater detail.

Figure 1:
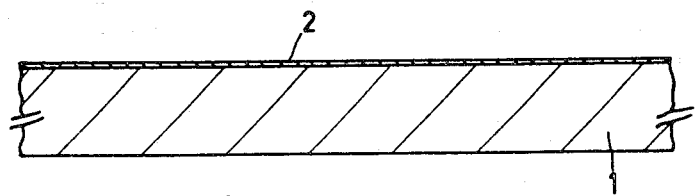
FIGS. 1 to 11 are diagrammatic cross-sectional views in successive stages of the manufacture of a semiconductor device according to the invention.
Figure 2:
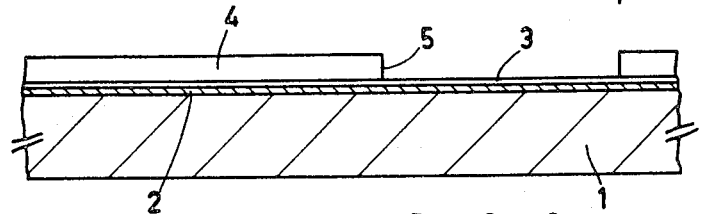
Figure 3:
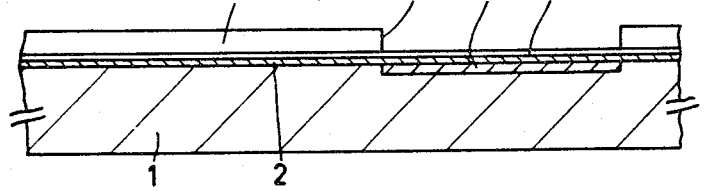
Figure 4:
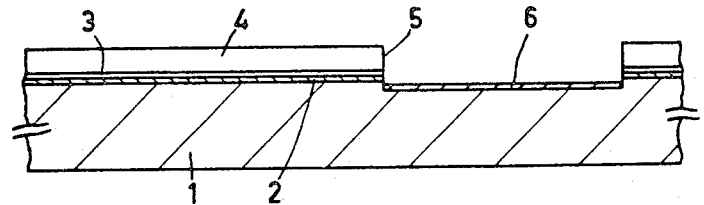

The starting point is p-type silicon wafer 1 having a resistivity of, for example, 25 ohm-cm. A surface of wafer 1 is provided with thin n-type layer 2, as shown in FIG. 1, by implantation of phosphorus ions (energy 30 keV, dose $2 \times 10^{13}$ ions/cm$^2$) in a thickness of less than 0.1. $\mu$m. By thermal oxidation the surface is provided with a thin silicon oxide layer 3 having a thickness of approximately 30 nm. A photolacquer layer 4 is provided thereon in which a window 5, as shown in FIG. 2, is formed by exposure and development. The surface is then bombarded with boron ions at an energy of 150 keV and a dose of $3 \times 10^{13}$ ions per cm$^2$. The boron ions penetrate through the oxide layer 3 but are retained by the photolacquer layer 4. In this manner p-type layer 6 (see FIG. 3) is formed which is at least partly compensated at the surface by the presence of the n-type doping concentration of the layer 2.

Figure 5:
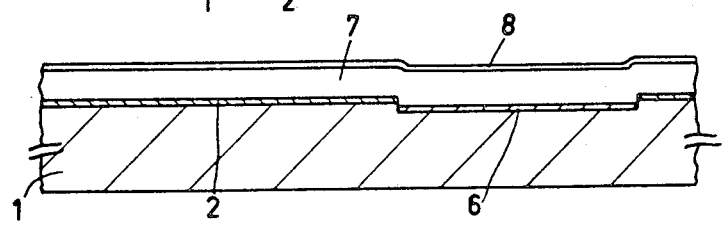

The oxide layer 3 and the layer 2 are then removed within the window 5 (see FIG. 4) after which the photolacquer mask 4 and the remainder of oxide layer 3 are removed. By means of conventional methods, 5 $\mu$m thick layer 7 of silicon is then grown epitaxially on the surface. The layer 7 is not doped and thus consists of high-ohmic (p-type or n-type) silicon. By thermal oxidation the layer 7 is provided with an approximately 50 nm thick layer 8 of silicon oxide, as shown in FIG. 5.

Figure 6:
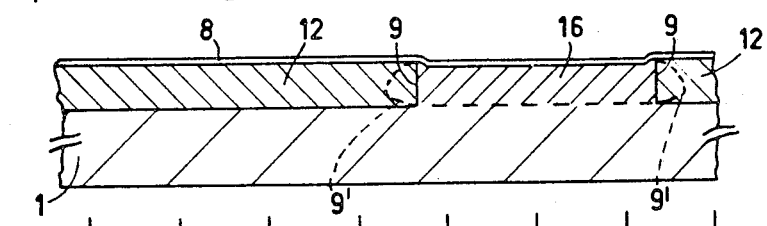

A heating at 1200° C. for 6 hours in nitrogen is then carried out (see FIG. 6). During this heating the dopants diffuse from the buried layers 2 and 6 through the whole thickness of the epitaxial layer 7 and into the substrate, the n-type region 12 and the p-type region 16 being formed with doping concentrations decreasing towards the surface. The p-n junction 9 between the regions 12 and 16 is substantially perpendicular to the surface since the diffusion coefficients of boron and phosphorus at the same diffusion temperature are substantially the same and also the doping concentrations of the buried layers 2 and 6 are substantially the same.

The lateral diffusions from the layers 2 and 6 thus compensate each other substantially entirely. For illustration FIG. 6 shows in broken lines the variation (9') of the p-n junction which would be obtained if only the buried layer 6 were present (and an n-type epitaxial layer were grown). The effect of the occurring lateral diffusion is clearly visible.

In this example, complementary insulated gate field effect transistors will be formed in the regions 12 and 16.

Figure 7:
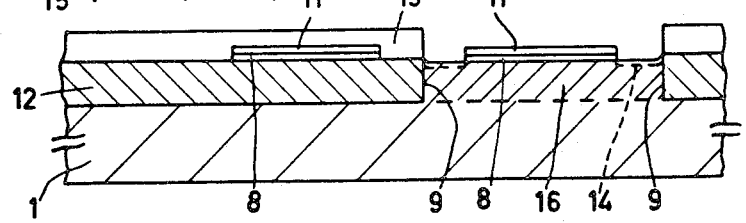

A silicon nitride layer 11 having a thickness of approximately 150 nm is then selectively formed on the oxide layer 8 by using conventional methods, as shown in FIG. 7, after which a photolacquer mask 13 is provided while using the same mask as was used for the formation of the window 5. While using the photolacquer layer 13 and the layers 8 and 11 as a masking, boron ions 15 are then implanted (see FIG. 7) at a dose of $3 \times 10^{13}$ ions/cm$^2$ and an energy of 25 keV to form channel stopping regions 14 with increased p-type doping concentration.

Figure 8:
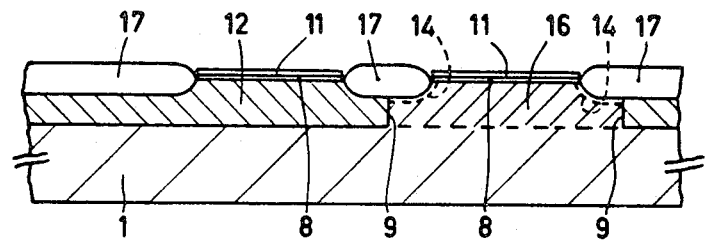

The photolacquer layer 13 is then removed and a thermal oxidation at 1100° C. is carried out for 3 hours as a result of which a partly countersunk oxide pattern 17 having a thickness of approximately 1.1 μm is formed on the parts of the surface not covered by the nitride layer 11, as shown in FIG. 8.

Figure 9:
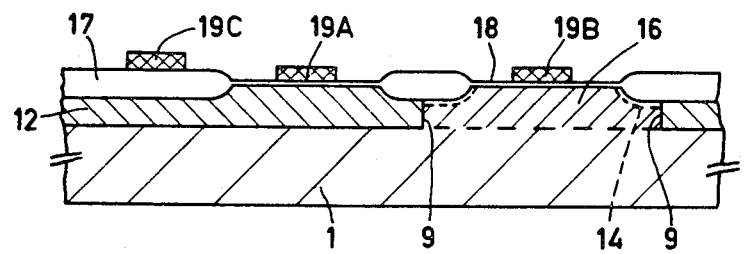

The layers 11 and 8 are then etched away, after which a gate oxide layer 18 having a thickness of 70 nm is formed by thermal oxidation, as shown in FIG. 9.

Since oxide layer 8 was present during both the diffusion to form regions 12 and 16 and the diffusion occurring during the formation of pattern 17, the surface doping of the region 16 was slightly lower than that of the region 12 because the boron dissolved slightly in the oxide during these diffusions, whereas the phosphorus was forced into the silicon. This effect was enhanced by the gate oxidation. As as result of this, the surface doping of the region 16 would yield too low a value for the threshold voltage of the n-channel MOST and the surface doping of the region 12 would yield too high a threshold voltage for the p-channel MOST. Therefore, a small quantity of boron ions is now implanted into the surfaces of both regions 12 and 16 so as to give the threshold voltages the desired values.

An approximately 0.5 μm thick polycrystalline silicon layer is then deposited from the gaseous phase on the whole surface, after which the polycrystalline silicon layer is made n-type conductive by means of phosphorus by diffusion or ion implantation. The polycrystalline silicon layer is then patterned into gate electrodes 19A and 19B and conductor 19C by etching.

Figure 10:
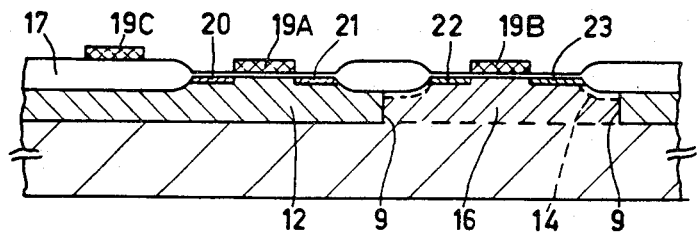

The source and drain zones 22 and 23 of the n-channel transistor are then formed in the usual manner by implantation of arsenic ions, and the source and drain zones 20 and 21 of the p-channel transistor are formed by implantation of boron ions, the control electrode layers 19 and the oxide pattern 17 serving as a masking, as shown in FIG. 10. The surface parts which are not to be exposed to the ions in question are each time covered by a non-critical mask, for example, a photolacquer mask.

Figure 11:
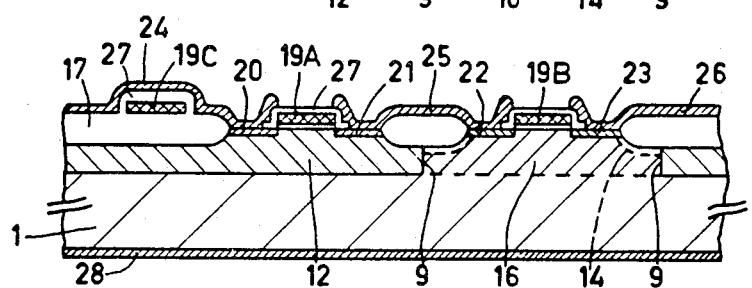

A layer 27 of pyrolythic SiO$_2$ is provided over the assembly in which contact windows are etched, as shown in FIG. 11. By metallization with, for example, aluminium and etching, the metal layers 24, 25 and 26 are obtained which contact the zones 20-23 within the contact windows. A pair of criss-crossed diagonal lines are shown for each plan view of FIG. 12 in the contact window.

The complementary MOS-transistors thus obtained are separated by p-n junction 9 which intersects the epitaxial layer 7 in a direction perpendicular to the surface. As a result of the absence of deflection of the p-n junction caused in known structures by lateral diffusion, a considerable space saving is obtained.

Instead of a p-type substrate, an n-type substrate might also be used. The n-channel transistor would then be present in an island-shaped p-type region which is fully surrounded by n-type material.

In the embodiment described the buried layers 2 and 6 were obtained by first providing the layer 2 over the whole surface, forming the layer 6 in a part of the surface, and then etching away the surface layer of the region 6 occupied by the layer 2. Instead of this, the layers 2 and 6 may also be provided beside each other so as to overlap each other by local diffusion or implantation. Alternatively, the layers 2 and 6 may be provided at a small distance from each other provided that this distance is so small that during the diffusion the out-diffused regions 12 and 16 adjoin each other.

Figure 12:
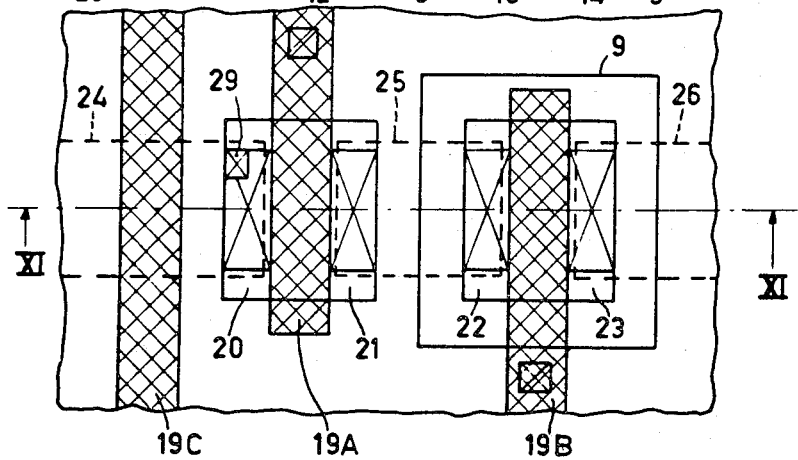

It is to be noted that the substrate regions 12 and 16 of both field effect transistors are contacted by providing a metal layer 28 on the rear side of the semiconductor wafer 1 (see FIG. 11) and by short-circuiting the region 12 with the zone 20 via a recess in the source zone within the contact window 29 (see FIG. 12). With a comparatively high-ohmic substrate, as in this case, it may be advantageous to also contact the region 16 at the upper surface in the same manner as the region 12.

FIGS. 13 to 19 show in successive stages an embodiment of the method in accordance with the invention in which a p-n junction field effect transistor (JFET) in combination with two insulated gate field effect transistors are manufactured.

Figure 13:
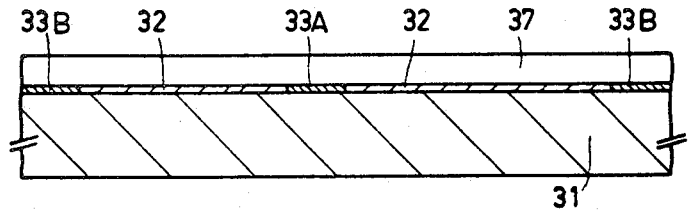
FIGS. 13 to 18 are diagrammatic cross-sectional views of successive stages of the manufacture of another semiconductor device also according to the invention.
Figure 14:
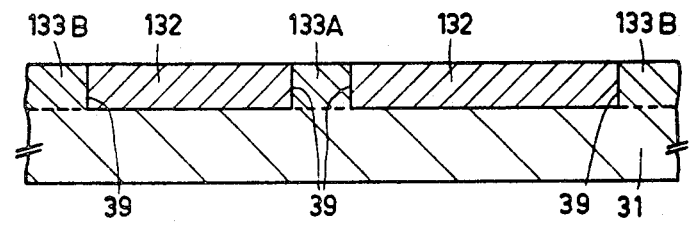

On an n-type silicon substrate 31 are provided beside each other a highly doped n-type layer 33A, a highly doped p-type layer 32 adjoining and fully surrounding layer 33A laterally, and an n-type layer 33B adjoining and fully surrounding layer 32 laterally. A non-doped or a weakly doped silicon layer 37 is then grown epitaxially on the whole surface so that in cross-section the structure shown in FIG. 13 is obtained. Providing the buried layers 32, 33A, and 33B and the epitaxial layer 37 may be carried out, for example, in the same manner as described in the preceding embodiment for realizing the structure shown in FIG. 5.

In analogy to FIG. 6 of the preceding embodiment, a heating step is then carried out, in which the dopants in buried layers 32, 33A, and 33B diffuse through the whole thickness of the epitaxial layer 37 towards the surface and into the substrate and form p-n junctions 39 (see FIG. 14) which with suitably chosen doping concentrations and diffusion coefficients of the donor and acceptor atoms (preferably phosphorus and boron) used for the formation of the buried layers 32, 33A, and 33B are substantially perpendicular to the surface and separate the n-type regions 133A and 133B from the p-type region 132. The region 133A has a substantially constant cross-section and is fully laterally surrounded by the region 132.

Figure 15:
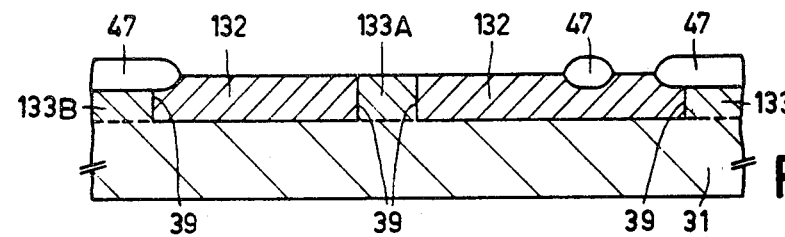
Figure 16:
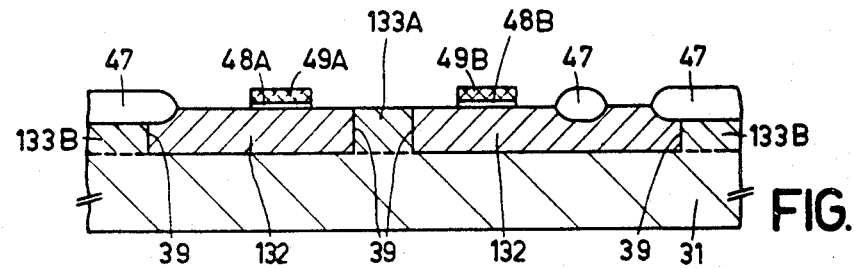
Figure 17:
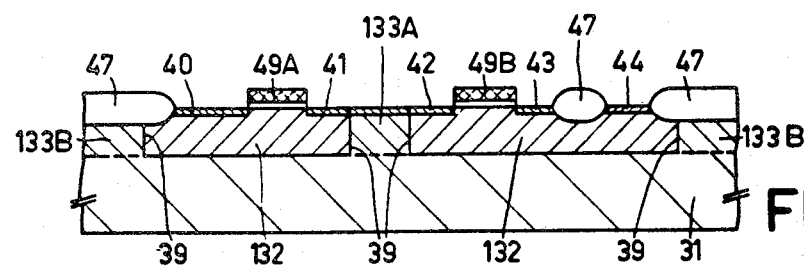
Figure 18:
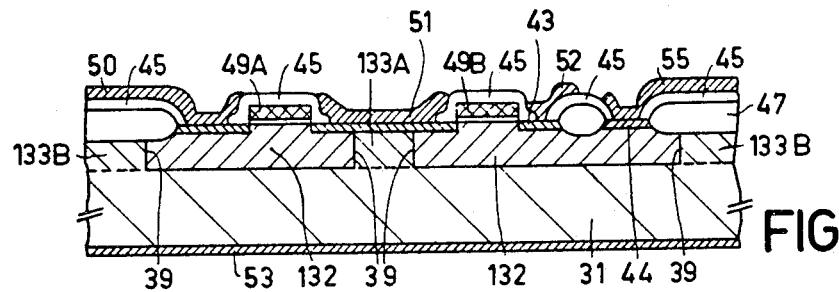

As shown in FIG. 15, at least a partly countersunk oxide pattern 47 is then provided in an analogous manner to the pattern 17 of the preceding example. Also as described and in the preceding example, a pattern of control electrodes 49A and 49B of polycrystalline silicon separated from the silicon surface by corresponding portions 48A and 48B of a thin silicon oxide layer is then formed after which with the use of control electrodes 49A and 49B and of the oxide pattern 47 as a mask, the n-type source and drain zones 40, 41, 42 and 43 are formed by implantation of arsenic atoms, and the highly doped p-type layer 44 is formed by implantation of boron ions, as shown in FIG. 17. To cover the regions not to be implanted, each time a non-critical mask, for example a photolacquer mask, is used. The implantation to form the zones 41 and 42 also serves to form an n+ contact layer on the region 133A.

A silicon oxide layer 45 is then deposited pyrolytically over the assembly (see FIG. 18) after which contact windows are etched in layer 45 and the circuit is contacted by means of metal layers 50, 51, 52 and 55. The contours of metal layers 50, 51, 52, and 55 are shown in broken lines in the plan view of FIG. 19, while each contact window is shown as a pair of criss-crossed diagonal lines. As in FIG. 12, the polycrystalline silicon layers 49A and 49B are shaded cross-wise in FIG. 19. A metal layer 53 is vapour-deposited on the rear side of the silicon wafer 31 for contacting the regions 31,133A and 133B; the region 132 is contacted on the p+ layer 44 by means of the metal layer 52.

Figure 20:
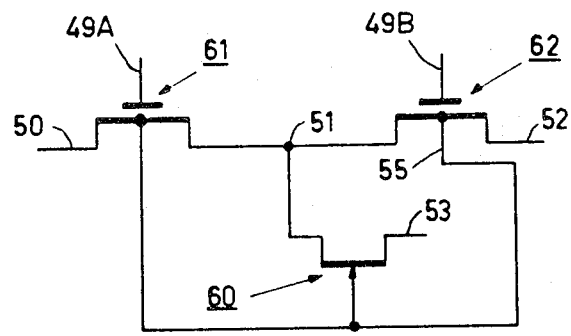
FIG. 20 is a circuit diagram of the semiconductor device shown in FIGS. 18 and 19.

The circuit thus obtained is shown diagrammatically in FIG. 20. This circuit comprises two insulated gate field effect transistors 61 and 62 and a junction field effect transistor 60. The junction field effect transistor 60 is formed by the source and drain electrodes 51 and 53 (see FIG. 18) with the intermediate channel region 133A, the control electrode zone being formed by the p-type region 132. Since all the p-n junctions 39 are substantially perpendicular to the surface, a channel region 133A with very small and constant cross-section (for example, with a width of 5 μm) can nevertheless be formed with very great accuracy by using the method according to the invention in that the effect of the lateral diffusion is eliminated substantially entirely.

The invention is not restricted to the two above-described embodiments but may be varied in a number of manners without departing from the scope of this invention. First of all, all conductivity types in each of the examples described may (simultaneously) be replaced by their opposite types. Semiconductor material other than silicon, for example, germanium III-V compounds, for example gallium arsenide, and the like, may also be used. Instead of control electrodes of polycrystalline silicon, control electrodes of metal may alternatively be used. The foregoing insulating and conductive layers may also be replaced by other materials. The use of an at least partly countersunk oxide pattern is not necessary, although desirable in many cases.

As regards the dopants and doping concentrations to be used for the formation of the buried layers 2, 6, 32, 33A, and 33B, phosphorus and boron will preferably be used for this purpose, at least in silicon, in particular due to their diffusion coefficients which are substantially equal at any temperature. As already said, however, other donor and acceptor atoms may also be used with silicon provided the dopings used are adapted to the diffusion coefficients. In order to remove the effect of the lateral diffusion more or less, the activator with the largest diffusion coefficient will have to have the smallest doping concentration, and conversely. By adapting these parameters to the desired result, p-n junctions may be formed between the n-regions and p-regions in the epitaxial layer by diffusion from the buried n-type and p-type layers, the orientation of which junctions varies between substantially perpendicular to the surface (with complete compensation of the lateral diffusions) to the form obtained with uncompensated one-sided lateral diffusion. In this manner, the desired "control" of the p-n junctions can be realized within given limits by those skilled in the art.

Finally it is to be noted that for the formation of the buried layers doping methods other than ion implantation may also be used, for example, diffusion from the gaseous phase or from a doped oxide layer or glass layer.

What is claimed is:

1. A method of manufacturing a semiconductor structure, characterized as comprising the steps of:
    introducing (1) a first dopant of a first conductivity type into part of a monocrystalline substrate region of a semiconductor body to define a first zone of the first conductivity type and (2) a second dopant of a second conductivity type opposite to the first conductivity type into part of the substrate region to define a second zone of the second conductivity type;
    growing an epitaxial semiconductor layer on the substrate region such that the first and second zones are first and second buried zones, respectively;
    causing the dopants to diffuse sufficiently into the epitaxial layer to establish (1) the entire portion overlying the first buried zone as a first epitaxial region of the first conductivity type and (2) the entire portion overlying the second buried zone as a second epitaxial region of the second conductivity type, the buried zones being sufficiently near each other that the epitaxial regions adjoin each other along substantially the entire thickness of the epitaxial layer to form a p-n junction, the species and concentrations of the dopants being so chosen that their lateral diffusions in the epitaxial layer substantially compensate each other fully along the p-n junction so that it is substantially perpendicular to the upper surface of the epitaxial layer; and
    forming at least one surface-adjacent zone of at least one electronic circuit element in at least one of the epitaxial regions, the resulting upper surface of the epitaxial layer being a monocrystalline semiconductor surface.

2. A method as in claim 1 characterized in that the step of forming comprises forming at least one surface-adjacent zone of at least one electronic circuit element in each epitaxial region.

3. A method as in claim 2 characterized in that the step of forming comprises introducing (1) a dopant of the second conductivity type into at least one portion of the first epitaxial region and (2) a dopant of the first conductivity type into at least one portion of the second epitaxial region.

4. A method as in claim 1 characterized in that the p-n junction terminates at the semiconductor surface.

5. A method of manufacturing a semiconductor structure, characterized by the steps of:
    introducing (1) a first dopant of a first conductivity type into a monocrystalline substrate region of a semiconductor body to define a substrate layer along an upper surface of the substrate region and (2) a second dopant of a second conductivity type opposite to the first conductivity type into the substrate region to define a substrate section below a part of the substrate layer;

substantially removing the part of the substrate layer above the substrate section;

growing an epitaxial layer over the remainder of the substrate layer and over the substrate section, the remainder of the substrate layer being a first buried zone of the first conductivity type, and the substrate section being a second buried zone of the second conductivity type; and causing the dopants to diffuse sufficiently into the epitaxial layer to establish (1) the entire portion of the epitaxial layer overlying the first buried zone as a first epitaxial region of the first conductivity type and (2) the entire portion of the epitaxial layer overlying the second buried zone as a second epitaxial region of the second conductivity type, the buried zones being sufficiently near each other that the first and second epitaxial regions adjoin each other along substantially the entire thickness of the epitaxial layer to form a p-n junction terminating at the upper surface of the epitaxial layer.

6. A method as in claim 5 characterized in that the step of introducing is performed by introducing the first dopant into the substrate region, forming a mask along the upper surface such that the mask has a window generally above the intended location for the substrate section, and introducing the second dopant into the substrate region through the window.

7. A method as in claim 6 characterized in that the step of substantially removing is performed with the mask in place by removing the part of the substrate layer below the window.

8. A method as in claim 7 characterized by the step of forming an insulating layer along the upper surface prior to formation of the mask, the part of the insulating layer below the window being removed during the step of substantially removing.

9. A method as in claim 5 characterized by the step of forming (1) a pair of source/drain regions of the second conductivity type for a first insulated gate field-effect transistor in the first epitaxial region and (2) a pair of source/drain regions of the first conductivity type for a second insulated gate field-effect transistor in the second epitaxial region.

10. A method as in claim 1, 2, 5, 6 or 9 characterized in that the epitaxial layer comprises silicon, the first dopant comprises phosphorus, and the second dopant comprises boron.

11. A method as in claim 9, characterized by the steps of: forming an insulating layer along the epitaxial layer at its upper surface prior to causing the dopants to diffuse to establish the epitaxial regions; and selectively implanting boron ions into the epitaxial regions at locations for channel regions for the transistors to establish their threshold voltages.

12. A method as in claim 5, characterized in that the substrate region is of the first conductivity type, the first buried zone is formed so as to comprise a buried portion fully laterally enclosed by the second buried zone whereby the first epitaxial region comprises an epitaxial portion fully laterally enclosed by the second epitaxial region, the epitaxial portion serves as a channel region for a junction field-effect transistor, and a pair of source/drain electrodes for the transistor are formed on the epitaxial layer at its upper surface and on the substrate region at its lower surface.

13. A method as in claim 5 or 6 characterized in that the dopants have substantially the same diffusion coefficients in the epitaxial layer at any chosen diffusion temperature.

14. A method as in claim 13 characterized in that the buried zones have substantially the same net dopant concentrations at their upper surfaces.

15. A method as in claim 5, 6, 9, or 12 characterized in that the p-n junction is substantially perpendicular to the upper surface of the epitaxial layer.

16. A method as in claim 1 or 5 characterized in that the buried zones substantially adjoin each other.

17. A method of manufacturing a semiconductor structure, comprising the steps of:

introducing (1) a first dopant of a first conductivity type into part of a monocrystalline substrate region of a semiconductor body to define a first zone of the first conductivity type and (2) a second dopant of a second conductivity type opposite to the first conductivity type into part of the substrate region to define a second zone of the second conductivity type juxtaposed in projection to the first zone;

growing an epitaxial semiconductor layer on the substrate region such that the first and second zones are first and second buried zones, respectively, the upper surface of the epitaxial layer forming the upper surface of the semiconductor body;

causing the dopants to diffuse sufficiently into the epitaxial layer to establish (1) the entire portion of the epitaxial layer overlying the first buried zone as a first epitaxial region of the first conductivity type and (2) the entire portion of the epitaxial layer overlying the second buried zone as a second epitaxial region of the second conductivity type, the buried zones being sufficiently near each other that the first and second epitaxial regions adjoin each other along substantially the entire thickness of the epitaxial layer to form a p-n junction terminating at the upper surface of the epitaxial layer, the species and concentrations of the dopants being so chosen that their lateral diffusions in the epitaxial layer substantially compensate each other fully along the p-n junction so that it is substantially perpendicular to the upper surface of the epitaxial layer; and forming at least one surface-adjacent zone of at least one electronic circuit element in at least one of the epitaxial regions.

18. A method as in claim 17 wherein the step of forming comprises forming at least one surface-adjacent zone of at least one electronic circuit element in each epitaxial region.

19. A method as in claim 18 wherein the step of forming comprises introducing (1) a dopant of the second conductivity type into at least one portion of the first epitaxial region and (2) a dopant of the first conductivity type into at least one portion of the second epitaxial region.

20. A method as in claim 17 wherein the epitaxial layer comprises silicon, the first dopant comprises phosphorus, and the second dopant comprises boron.

21. A method as in claim 17 wherein the dopants have substantially the same diffusion coefficients in the epitaxial layer at any chosen diffusion temperature.

22. A method as in claim 21 wherein the buried zones have substantially the same net dopant concentrations at their upper surfaces.

* * * * *